United States Patent

Schmidt

[15] 3,658,584

[45] Apr. 25, 1972

[54] SEMICONDUCTOR DOPING COMPOSITIONS

[72] Inventor: John G. Schmidt, St. Louis, Mo.

[73] Assignee: Monsanto Company, St. Louis, Mo.

[22] Filed: Sept. 21, 1970

[21] Appl. No.: 74,204

[52] U.S. Cl. .................................. 117/201, 252/1, 148/189
[51] Int. Cl. ........................................................ H01l 3/00
[58] Field of Search ...................... 117/201; 252/1; 148/189

[56] References Cited

UNITED STATES PATENTS 3,540,951 11/1970 Pammer et al. .................... 117/201 X

*Primary Examiner*—William L. Jarvis
*Attorney*—William I. Andress, John D. Upham and Neal E. Willis

[57] ABSTRACT

The disclosure herein relates to semiconductor doping compositions and to methods for their preparation and use. More particularly, the disclosure relates to liquid silica-based doping compositions which may be applied to a surface of a semiconductor substrate and, upon heating, an impurity is diffused from a film of the doping composition into the substrate to form a region therein having the desired electrical properties.

20 Claims, No Drawings

SEMICONDUCTOR DOPING COMPOSITIONS

BACKGROUND OF THE INVENTION

This invention pertains to the field of semiconductor doping compositions and methods for their preparation and use.

In the manufacture of semiconductor devices having designated areas therein of specific electrical conductivity, numerous procedures have been employed. Various of these procedures include epitaxial deposition, either by vapor phase or liquid phase techniques, to form films of the same or different semiconductor material upon a substrate. The epitaxial film usually contains a distribution of impurity atoms of a given type and/or concentration different from that of the substrate material. By use of photolithographic techniques, selected areas of the substrate or the epitaxial film may be masked from or exposed to further processing, including impurity diffusion and the deposition of additional epitaxial layers, passivation layers and/or contact metallization.

Pertinent to this invention are various methods for the diffusion of impurities into semiconductor materials. Prior art methods include impurity diffusions from a solid or vapor phase source into the whole surface or selected areas of the surface of a semiconductor substrate. However, these diffusions are, in general, unreliable, nonreproducible, give imprecise results and, in vapor phase diffusions, require elaborate gas distribution systems including valves, cocks, joints, etc.

Attempts have been made to circumvent the problems and generally unreliable results of solid and gas phase diffusions by means of liquid doping compositions, which include a variety of organic and inorganic slurries, mixtures and solutions which may be painted, sprayed, spun or centrifuged onto the semiconductor body, or into which the latter may be dipped. Among the liquid doping compositions described in the prior art are, e.g., colloidal dispersions of particulate silicon dioxide in a liquid medium containing dissolved doping materials (U.S. Pat. No. 3,514,348); liquid polymers containing a homogeneous mixture of trimethoxyboroxine and methyl trimethoxysilane, or use of the boroxine compound alone (U.S. Pat. No. 3,084,079); and mixtures of ground glasses suspended with a heat-depolymerizable binder in a solvent (U.S. Pat. No. 2,794,846).

The use of liquid doping compositions has introduced numerous additional problems. For example, many of these liquids are incapable of producing thin films or films free of pin holes through which contaminants penetrate to degrade surface properties of the semiconductor. Even colloidal silica particles coated with an oxide of the dopant element are inadequate to produce continuous doping films which are smooth, uniform and free of pin holes. Other disadvantages of some prior art liquid doping compositions, include an inhomogeneous distribution of the dopant agent or the need for dispersing agents or binding agents to keep the solid material in suspension. Still another disadvantage of at least one prior art liquid doping composition is the need to oxidize liquid organic polymer to release the dopant from the polymer. The organic radicals, at diffusion temperatures, are thermally decomposed, thus resulting in organic residues in the doping layer. A further limitation on some liquid doping compositions is the reactivity of the components thereof, e.g., alkali metals, free water, carbonaceous decomposition products, etc., with the semiconductor substrate, resulting in problems such as nonadherence of the doping film, surface degradation and imperfections, irregular diffusion profiles, low yields and degradation of electrical properties. A particularly troublesome characteristic of some prior art doping compositions is the tendency to gel and/or solidify rapidly, resulting in a short shelf life and requiring use within a few hours or a few days after preparation.

SUMMARY OF THE INVENTION

The present invention relates to novel semiconductor doping compositions, method for their preparation and use in doping semiconductor bodies for use in a variety of electronic devices.

The doping compositions herein comprise colloidal dispersions of a solid copolymer of hydrated silica and a hydrated oxide of a dopant element homogeneously dispersed in a polar solvent.

In its preferred embodiment, the process for producing the doping compositions of the invention involves the hydrolysis of hydrolyzable compounds of silicon and the doping element in a water-containing polar solvent. The hydrolysis results in the production of fully hydrated oxides of silicon and the dopant element. Reaction between the hydrated oxides results in partial intermolecular dehydration thereof and formation of colloidal particles of a solid copolymer of hydrated silica and the hydrated dopant oxide homogeneously dispersed in the aqueous solvent.

The semiconductor doping compositions of the invention are applied to form a film upon the desired surface of the semiconductor to be treated, and upon heating to elevated temperatures volatile constituents are removed and, at diffusion temperatures, dopant atoms are diffused from the film uniformly into the semiconductor to the desired depth and in the desired concentration.

It is a significant advantage of the present invention that the above-described process provides maximum mixing and distribution of the silicon and dopant atoms within the copolymeric network of the semiconductor doping compositions and diffusion films of the invention. By virtue of the uniform distribution of silicon and dopant atoms, the latter is uniformly diffused from the film into the semiconductor.

In addition, the novel structure of the solid copolymer of hydrated oxides of silicon and the dopant atom homogeneously dispersed in a water-containing polar solvent provides for the application of adherent films which are continuous, uniform and free of pin holes.

The extreme simplicity and efficacy of application of the films of this invention is shown by the fact that a very small quantity, e.g., 1–3 drops, of the doping composition can be placed on a stationary semiconductor wafer and then momentarily spun rapidly to distribute the doping composition uniformly over the surface of the wafer; only one such application of doping solution and one such momentary spinning is all that is required to apply the film of doping composition. This contrasts with a prior art method which requires the sequential application of several drops of a doping composition to the surface of a spinning wafer, each drop being spun dry before the next is applied, to build up a stratified succession of layers of the diffusion film.

Still another advantage of the present invention is the provision of semiconductor doping compositions which require no organic binders to suspend the solid components of the composition and, further, which have no organic groups which must be thermally decomposed by oxidation to release the dopant atoms and introduce possible residual organic contaminants.

It is, therefore, an object of the present invention to provide new and improved semiconductor doping compositions, method for their preparation and application.

It is another object of this invention to provide a doping film which at diffusion temperatures is free of pin holes, inhomogeneous impurity distribution and deleterious components such as alkali metals, free water, organic residues, etc.

Still another object of this invention is the provision of a long shelf life semiconductor doping composition in which the dopant atoms are uniformly dispersed and can be diffused from an adherent film of the composition into a semiconductor body in controlled quantities in reproducible manner.

Yet another object of this invention is the provision of a process for producing semiconductor doping compositions and diffusion films which is simple, economical and is useful in doping semiconductor bodies with high-yield results.

DESCRIPTION OF THE PREFERRED EMBODIMENT

In accordance with the preferred embodiment of this invention, semiconductor doping compositions are prepared by the hydrolysis of hydrolyzable compounds of silicon and the dopant element in a water-containing polar solvent to form the fully hydrated oxides of silicon and the dopant atom. The hydrated oxides immediately begin to copolymerize through partial intermolecular dehydration to form a homogenous colloidal dispersion of solid copolymer of hydrated silica and hydrated oxide of the dopant element in the polar solvent.

EXAMPLE 1

This example illustrates the preparation and use of a semiconductor doping composition containing boron as the dopant.

Three and one-half grams of triethylborate, $B(OC_2H_5)_3$, are dissolved in 33 grams of absolute ethanol as a first solution; 12 grams of tetraethylorthosilicate, $Si(OC_2H_5)_4$, are dissolved in 33 grams of absolute ethanol as a second solution. As a third solution 16.5 grams of ethanol are mixed with 16.5 grams of water. Solutions one and two are mixed and the third solution is immediately poured into the mixture of the first two.

The above mixture is then ready for immediate application as a film to a semiconductor body. However, it is preferable to allow the mixture to set for one or two days to permit copolymerization of the hydrated oxides of silicon and boron. This hydrated binary oxide doping composition is sufficiently stable that it may be stored for months prior to use.

The doping composition prepared according to the embodiment of this example is used to diffuse boron into a semiconductor wafer, such as silicon, of n-type conductivity to form therein a region of p-type conductivity. A wafer of n-type silicon 1 and ¼ inches in diameter doped with arsenic to a carrier concentration of about $2.5 \times 10^{17}$ atoms/cc is prepared for the diffusion by conventional means of lapping and polishing. The wafer is placed on a spinner and, while stationary, a small quantity, e.g., about two drops, of the doping composition is placed in the center of the wafer. The wafer is then spun at approximately 6,800 rpm, immediately covering the entire surface of the wafer with a single, continuous layer about 1,000 A. thick.

After the doping composition has been applied to the silicon wafer it is placed in a diffusion furnace and heated to a first elevated temperature, e.g., 350° C, sufficiently high to vaporize any volatile components which remain after the high-speed spinning operation, including the solvent, and bound water of hydration, and leave a cohesive, adherent film comprised of a copolymer of the dehydrated oxides of silicon and boron. The film thus formed is characterized by a uniform network of repeating Si-O-B, Si-O-Si and B-O-B units homogeneously dispersed in the binary oxide with the percentage of Si-O-B and Si-O-Si units being maximized by the simultaneous in situ formation of the respective hydroxides. The silicon and boron atoms are present preferably in a ratio of at least one-to-one and have only oxygen atoms attached thereto.

Following the initial heating to drive off any volatile components, the silicon wafer coated with doping film is then further heated at diffusion temperatures of about 1,150° C for about 1 hour during which time boron diffuses from the binary oxide network into the silicon wafer to form a surface layer of p-type conductivity about $2.0\mu$ thick and having a surface concentration of approximately $2.8 \times 10^{19}$ atoms/cc.

With further regard to the spun-on film thickness, hence, the total available quantity of dopant atoms, the thickness can be varied by changing the ratio of copolymer to solvent in the original reaction mixture or by subsequent dilution prior to use. Alternatively, the ratio of dopant atoms to silicon atoms in the original mixture can be varied.

The partial solvation of the copolymer hydrate effects dispersion stability and homogeneity, which results in superior properties as a doping composition and allows a single application to be sufficient and maximum. Subsequent applications will not increase the total film thickness, unless the wafer is heated between applications to a sufficiently high temperature to drive off bound water of hydration and convert the copolymer hydrate to a dehydrated binary oxide. In contradistinction, an analogous operation performed in the prior art referenced above (U.S. Pat. No. 3,514,348) involves placing a drop of a doping liquid on a wafer spinning at 2,500 rpm to form and dry a first layer of a doping film and repeating this operation sequentially on the spinning wafer with a series of drops to build up successive layers in the diffusion coating.

EXAMPLE 2

This example illustrates the preparation and use of doping composition containing arsenic as the dopant.

In a first container tetraethoxysilane (tetraethylorthosilicate), $Si(OC_2H_5)_4$, in the amount of 11.9 grams is dissolved in 50 ml of absolute ethanol. In a second container, 2.0 grams of arsenic pentoxide, $As_2O_5$, is dissolved in 50.0 ml of water. After solution was complete, 0.05 gram (0.03 ml) of $TiCl_4$ is added to the second solution. Thereafter, equal volumes of the mixtures in the two containers are mixed together and allowed to react. After completion of the reaction, the doping composition may be used immediately, or stored for later use.

The colloidal dispersion of hydrated oxides of silicon and arsenic in aqueous ethanol can be used to form a diffusion film similarly as in the preceding example.

EXAMPLE 3

In the embodiment of this example 4.15 grams of antimony trichloride, $SbCl_3$, are dissolved in 100 mls of solvent consisting by volume of 90 percent ethanol and 10 percent water. To this solution is added dropwise with vigorous stirring 8.33 grams of tetrachlorosilane, $SiCl_4$. Intermolecular partial dehydration occurs between the in situ formed hydrates and forms a copolymer of hydrated oxides of silicon and antimony homogeneously dispersed in aqueous ethanol. This doping composition may be used immediately or stored for later use as described in the preceding embodiments.

EXAMPLE 4

In this example is described an embodiment for the preparation and use of a semiconductor doping composition containing zinc as the dopant.

Twelve grams of zinc bromide, $ZnBr_2$, are dissolved in a solution of 50 ml of water in 150 ml of isopropyl alcohol. After solvolysis is complete, 35 ml of tetraethoxysilane, $Si(OC_2H_5)_4$, is added. The container is then sealed for a reaction period of 24 hours. In this embodiment, the by-product HBr serves as a catalyst for hydrolysis of the $Si(OC_2H_5)_4$. Thereafter, the colloidal dispersion of the copolymer of the hydrated oxides of silicon and zinc may be used to form a diffusion film on a III–V compound semiconductor such as gallium arsenide, GaAs.

The doping composition is spun onto a wafer of n-type GaAs in the manner described above. Due to the presence of water in the spun-on film and the reactivity of GaAs with oxygen, a low temperature, e.g., less than 300° C, vacuum ($10^{-6}$ Torr) extraction of the bound water is employed prior to diffusion. An alternative modification is to coat the GaAs wafer with a layer of silica, e.g., 500–1,000 A. thick, prior to the spin-on operation. Thereafter, the GaAs wafer is heated to 875° C for about 1 hour to diffuse zinc into the wafer and form a surface layer of p-type conductivity about $5\mu$ deep.

EXAMPLE 5

In this embodiment is described the preparation and use of a doping composition containing phosphorus as the dopant element.

Three grams of phosphorus oxychloride, $POCl_3$, are added dropwise with vigorous stirring to ninety (90) milliliters of absolute ethanol. 8.33 grams of tetrachlorosilane are then added dropwise with vigorous stirring. The solution is maintained near 0° C by immersing the container in an ice-water bath during the addition of both reactants. Stirring is continued for an additional half hour while the solution is allowed to come to room temperature. Ten milliliters of water are then added to the reaction vessel and the solution is then allowed to set for 24 hours. Hydrolysis and subsequent intermolecular dehydration with copolymerization gives a solid copolymer homogeneously dispersed in the aqueous ethanol.

A small amount of the doping composition prepared above is spun onto a wafer of P-type silicon containing about $2 \times 10^{17}$ atoms/cc of boron. The wafer is then put in a diffusion furnace and heated in a nitrogen atmosphere to 1,150° C for about 1 hour. The phosphorus diffuses from the copolymer film into the silicon wafer to form a p-n junction about $5\mu$ deep with a surface concentration of about $2 \times 10^{20}$ atoms/cc of phosphorus.

In accordance with the preferred embodiments for carrying out the process of this invention to obtain maximum mixing and distribution of the silicon and dopant atoms within the copolymeric network of the semiconductor doping compositions and diffusion films of the invention, it is essential that when the silicon and dopant element compounds are hydrolyzed simultaneously in the same reaction vessel, the hydrolysis rates for both compounds are essentially the same. In some cases, it will be necessary to use a hydrolysis catalyst to affect the rate of hydrolysis of one or more of the starting materials. In other cases, the hydrolysis occurs so rapidly that no added catalyst is necessary.

In a manner similar to that described in the foregoing embodiments, doping compositions comprising colloidal dispersions of copolymers of hydrated oxides of silicon and other dopant elements are suitably prepared and useful for doping a variety of semiconductor materials. Exemplary other semiconductor materials include III–V compounds, i.e., the nitrides, phosphides arsenides and antimonides of boron, aluminum, gallium and mixtures thereof; II–VI compounds, i.e., the sulfides, selenides and tellurides of beryllium, zinc, cadmium and mercury and mixtures thereof; I–VII compounds having the cubic zinc blende structure such as the bromides, chlorides, iodides and fluorides of copper, silver, gold, sodium, lithium, rubidium and cesium; and Group IV elements, e.g., germanium and alloys thereof with silicon.

Suitable impurities for the doping compositions of this invention include those commonly known to and used in the art as acceptors, donors and traps to obtain the desired electrical conductivity. For example, suitable dopants for the III–V compounds include elements in Group II of the periodic system, e.g., zinc, cadmium, mercury to obtain p-type conductivity; and elements from Groups IV and VI such as germanium, tin, lead, sulfur, selenium and tellurium to obtain n-type conductivity. Suitable dopants for semiconductor elements from Group IV and their alloys include elements from Groups III and V, such as boron, aluminum, gallium and indium to obtain p-type conductivity and arsenic, phosphorus and antimony to obtain n-type conductivity. Suitable dopants for the II–VI compounds include elements from Groups I and V of the periodic system to produce p-type conductivity and elements from Group III to produce n-type conductivity.

It will be appreciated by those skilled in the art that where certain dopants have unique pecularities in some semiconductors, necessary adjustments in diffusion conditions will have to be made. For example, gold diffuses rapidly in silicon by interstitial diffusion, hence a shorter time and lower temperature is required, than with, e.g., arsenic which diffuses very slowly by a substitutional mechanism in silicon.

As indicated above, the doping impurities are incorporated together with the silicon, into the copolymeric hydrated oxides via partial intermolecular dehydration of the hydrated oxides of silicon and the dopant element. Preferably, the hydrated oxides of silicon and the dopant element are formed in situ by the simultaneous hydrolysis of hydrolyzable compounds of silicon and the dopant element followed by copolymerization of the hydrated oxides of silicon and the dopant element. Alternatively, when the hydrate of the doping impurity shows little tendency for intramolecular dehydration, it may be formed first. The hydrolyzable silicon compound is then hydrolyzed in the solution of the hydrate of the doping element. The immediate partial intramolecular dehydration of the hydrate of silica is accompanied by intermolecular dehydration and formation of the copolymer. It is to be understood that the hydrolysis of the silicon compound results in the existence of the full complement of hydroxyl groups, but not necessarily simultaneously, and that partial dehydration of the formed hydrate is essentially an instantaneous reaction. When the fully hydrated oxide, per se, is formed it probably exists only as a transitory intermediate.

Illustrative hydrolyzable starting materials within the broad purview of this invention for producing the hydrated oxides of both silicon and the dopant element, include oxides, halides, hydrides, acylates, hydrocarbylates and alkoxides of silicon and the dopant element. As used herein an alkoxide includes the alcoholates, (i.e., esters of organic alcohols and inorganic acids), and esters of organic acids and non-metal hydroxides (also defined in the literature as salts of organic acids). The hydrocarbyl moieties referred to herein include alkyl and aryl radicals, and are exemplified preferably by lower alkyls having one to six carbon atoms and the phenyl radical, respectively.

With respect to the solvents useful herein, the principal characteristics are that the solvent must be capable of dissolving all initial reactants; should be a polar solvent capable of stabilizing a charged colloidal suspension therein and relatively volatile at room temperature without decomposition. Exemplary solvents suitable for use herein include alcohols, ethers, esters, ketones and mixtures thereof. Preferred solvents include acetone and lower alkanols, e.g., methanol, ethanol, isopropanol and esters such as ethyl acetate.

With further respect to the hydrolysis catalyst, preferably a Lewis Acid catalyst is used. The catalyst can be added separately or it may be generated internally, e.g., where hydrogen chloride is a by-product of reaction. Suitable catalysts include mineral acids, aluminum and titanium halides and alkyls, e.g., $AlCl_3$, $TiCl_4$, triethylaluminum, triisopropyl-aluminum, tetraethyltitanium, tetraisopropyltitanium and the like.

The doping compositions of the present invention are eminently suitable for use in the fabrication of a wide spectrum of electronic devices. Small or large surface areas of semiconductor substrates may be processed by conventional techniques of photolithography, masking, etching, diffusion, etc., to form regions in the semiconductor having the desired electrical conductivity. By suitable selection of the appropriate doping impurity, one can fabricate any desired semiconductor structure, then e.g., for junction devices utilizing P/N, N/P, N/P/N, P/N/P, P/I/N, N+/N/N+, P+/N/N+ or other desired structures. A further example of devices of commercial interest are those utilizing the buried layer or sub-diffused structure where a thin region of specified electrical conductivity is formed within a substrate of semiconductor material of different electrical conductivity and an epitaxial layer then deposited over the surface of the semiconductor. Other applications for the semiconductor doping compositions of this invention are found in the fabrication of light-emitting diodes, transistors, rectifiers, microwave devices and others too numerous to mention.

Various other modifications of this invention will occur to those skilled in the art without departing from the spirit and scope thereof.

I claim:

1. A semiconductor silica-based doping composition comprising a colloidal suspension of a solid copolymer of hydrated oxides comprising hydrated silica and at least one hydrated oxide of a dopant element homogeneously dispersed in an aqueous polar solvent.

2. Composition according to claim 1 wherein the silicon and dopant atoms in said copolymer are present in a ratio of at least one silicon atom to one dopant atom.

3. Composition according to claim 2 wherein said silicon and dopant atoms have only oxygen atoms attached thereto.

4. Composition according to claim 3 wherein said dopant atoms are selected from the group consisting of acceptors, donors and traps.

5. Composition according to claim 4 wherein said acceptors are selected from the group consisting of Group V elements.

6. Composition according to claim 5 wherein the Group V element is selected from the group consisting of phosphorus, arsenic and antimony.

7. Composition according to claim 4 wherein said donors are selected from the group consisting of Group III elements.

8. Composition according to claim 7 wherein the Group III element is selected from the group consisting of boron, aluminum, gallium and indium.

9. Process for the preparation of a colloidal suspension of a solid copolymer of hydrated oxides comprising hydrated silica and at least one hydrated oxide of a dopant element homogeneously dispersed in an aqueous polar solvent which comprises reacting a silicon hydroxide with a hydroxide of said dopant element in said solvent.

10. Process according to claim 9 wherein said silicon hydroxide and said hydroxide of a dopant element are prepared by hydrolyzing a hydrolyzable silicon compound and a hydrolyzable compound of said dopant element in said solvent.

11. Process according to claim 10 wherein said hydrolyzable silicon and dopant element compounds are selected from the group consisting of halides, hydrides, oxides, alkoxides, esters and alkyl and aryl derivatives of said compounds.

12. Process according to claim 10 wherein the hydrolysis is carried out in the presence of a hydrolysis catalyst.

13. Process according to claim 10 wherein the silicon and dopant element in said copolymer have only oxygen atoms attached thereto.

14. Process according to claim 10 wherein the silicon-to-dopant element atomic ratio in said copolymer is at least one-to-one.

15. Process according to claim 11 wherein said silicon compound is a tetrahydrocarbyloxysilane; said compound of a dopant element is selected from the group consisting of the hydrocarbyloxy derivatives of arsenic, boron, phosphorus and antimony and said polar solvent is an alcohol.

16. Process according to claim 11 wherein the silicon compound is tetraethoxysilane; the compound of a dopant element is arsenic pentoxide and the polar solvent is aqueous ethanol.

17. Process for doping semiconductor materials which comprises:

a. applying to the surface of said semiconductor a film of a doping solution comprising a colloidal suspension of a solid copolymer of hydrated oxides comprising hydrated silica and at least one hydrated oxide of a dopant element homogeneously dispersed in an aqueous polar solvent;
b. evaporating said solvent from the said film; and
c. heating the filmed semiconductor to drive off water and leave a dehydrated copolymer of said oxides from which the dopant element is diffused into said semiconductor at sufficiently high temperature.

18. Process according to claim 17 wherein said semiconductor materials are selected from the group consisting of silicon, germanium, and mixtures thereof, I–VII, II–VI and III–V compounds and mixtures thereof.

19. Process according to claim 17 wherein the silicon and dopant element in said copolymer have only oxygen atoms attached thereto.

20. Process according to claim 17 wherein the silicon-to-dopant element atomic ratio in said copolymer is at least one-to-one.

* * * * *